United States Patent [19]
Lee et al.

[11] Patent Number: 5,825,054
[45] Date of Patent: Oct. 20, 1998

[54] PLASTIC-MOLDED APPARATUS OF A SEMICONDUCTOR LASER

[75] Inventors: Biing-Jye Lee; Horng-Nign Chen, both of Hsinchu; Jung-Tsung Hsu, Hsien, all of Taiwan

[73] Assignee: Industrial Technology Research Institute, Hsinchu, Taiwan

[21] Appl. No.: 581,246

[22] Filed: Dec. 29, 1995

[51] Int. Cl.$^6$ .................................................. H01L 33/00
[52] U.S. Cl. ........................... 257/98; 257/99; 257/675; 257/676; 257/693
[58] Field of Search ................................ 257/98, 99, 678, 257/680, 676, 764, 693

[56] References Cited

U.S. PATENT DOCUMENTS

| 3,267,341 | 8/1966 | Euander | 317/234 |
| 4,995,687 | 2/1991 | Nagai et al. | 350/96.2 |
| 5,500,768 | 3/1996 | Doggett et al. | 359/652 |

FOREIGN PATENT DOCUMENTS

| 62-131587(A) | 6/1987 | Japan . |
| 63-187673(A) | 8/1988 | Japan . |
| 3-142886(A) | 6/1991 | Japan . |

*Primary Examiner*—Sara W. Crane
*Assistant Examiner*—Douglas A. Wille
*Attorney, Agent, or Firm*—Ladas & Parry

[57] ABSTRACT

A plastic-molded apparatus for a semiconductor laser is disclosed, which comprise: a first lead having a broad end thereof serving as a mounting plate; a second lead located at one side of the first lead; a third lead located at other side of the first lead; a submount, disposed on a front end of the mounting plate, having a semiconductor laser chip disposed thereon, electrically connected to the second lead, and a monitor detector disposed on the mounting plate closely adjacent to the submount, electrically connected to the third lead, for receiving backward light from the semiconductor laser chip; a plastic-molded header to fix the first lead, the second lead and the third lead; and a transparent cap, adapted to the plastic-molded header, for sealing all components including the laser chip, the monitor detector and peripheral parts on the plastic-molded header.

14 Claims, 5 Drawing Sheets

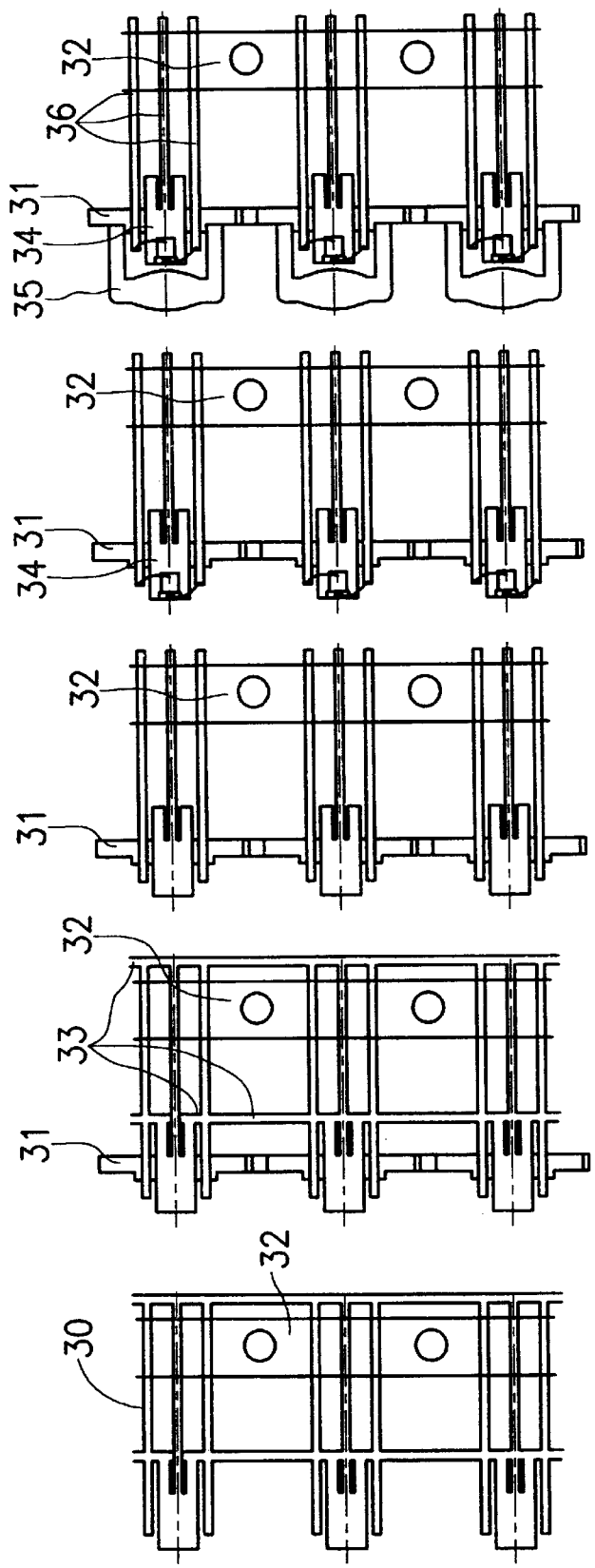

PLASTIC-MOLDED APPARATUS OF A SEMICONDUCTOR LASER

BACKGROUND OF THE INVENTION

1. Field of the Invention

The present invention relates to a semiconductor laser apparatus, and more particularly relates to a plastic-molded apparatus of a semiconductor laser.

2. Description of Prior Art

Currently, the semiconductor laser apparatus has been widely used as the light source for an optical pointer, a bar-code reader or in an optical information processing apparatus such as pickup head in compact disc players and video disc or as a light source for optical communications apparatus.

The difficulty of reducing the cost of conventional semiconductor laser apparatus, as compared with LED or other semiconductor devices, is because of the expensive packaging materials and components.

The conventional semiconductor laser apparatus is of the metal can type as shown in FIG. 1, in which a silicon submount 2 and a laser chip 3 are disposed on a gold-plated stem 1 of about 1 $\mu$m in thickness, and its surface is further covered with a cap 5 having a window glass 4 coated with an anti-reflection film. This cap 5 is filled with $N_2$ gas during the sealing process.

In such conventional semiconductor laser apparatus, parts other than the laser chip, such as header and cap, are expensive, making it difficult to achieve a desired low cost product. Furthermore, since structurally the semiconductor laser apparatus has a wide-spread radiated beam, a lens system for correcting the beam is necessary, and the entire optical pickup device for composing the optical system becomes too expensive.

To avoid the drawbacks of the prior art mentioned above, a semiconductor laser apparatus that is less expensive to fabricate is disclosed in U.S. Pat. No. 5,068,866. This semiconductor laser uses the ordinary plastic-sealed technique of LED technology to seal the semiconductor laser apparatus. Referring to FIG. 2, in which a laser chip 12 is directly disposed on the surface of a silicon submount 13, near the front tip of the upper surface of the support member 11. The silicon submount 13 is fitted to the support member 11. The laser chip 12, the silicon submount 13, and a photodetector chip 14 are integrally sealed within a transparent plastic resin 15. In addition, a lens can be directly formed on the seal by the transparent plastic resin 15.

The semiconductor laser apparatus mentioned above indeed reduces the cost since no expensive materials and parts are required in the system. However, this conventional semiconductor laser apparatus suffers from some other problems. For example, the heat-dissipation is inferior since all parts of the semiconductor laser apparatus are integrally sealed within and directly covered by transparent plastic resin. This causes shortening of the operating lifetime of the semiconductor laser apparatus. Secondly, as a result of structural limitations, only a single-sided lens can be formed on the front end of the cap, and the focus length of the lens cannot be adjusted. Therefore, the focusing of the semiconductor laser apparatus is of poor quality. Thirdly, the reflectivity comes from the refractive index of the sealing plastic resin.

SUMMARY OF THE INVENTION

Accordingly, to overcome the drawbacks of the prior-art semiconductor laser apparatus, the object of the present invention is to provide a plastic-molded apparatus for a semiconductor laser, which forms plastic-molded header on the lead frame, instead of the conventional semiconductor laser apparatus of the metal can type, to reduce the cost. Furthermore, a dark color plastic header may absorb backward light from the laser chip to prevent diffraction of the laser beam and the backward light.

Another object of the present invention is to provide a plastic-molded apparatus of semiconductor laser, which has good heat-dissipation since two heat-dissipation plates extending from the mounting plate outside the semiconductor laser apparatus are employed to conduct heat to the outside.

Still another object of the present invention is to provide a plastic-molded apparatus for a semiconductor laser, which has high light-coupling efficiency. The coupling process of the semiconductor laser and the focusing lens can be accomplished before sealing all parts on the header within a cap, thus providing the semiconductor laser apparatus with high output power.

One aspect of the present invention is to use a plastic-molded cap to seal the semiconductor laser apparatus so that the cost can be reduced and the manufacturing process is suitable for mass production.

To accomplish the above objects, in the present invention, a header is made of plastic material and is formed on a lead frame including a plurality of triple-leads. The central lead of each triple-lead has a broad end which serves as a mounting plate. An arrangement mount is formed on the mounting plate, and then a laser chip and a monitor detector are disposed on the arrangement mount at the front end of the lead frame. The cap can be formed by injection molding transparent acrylic resin such as PC or PMMA and coating AR (anti-reflection)-coated on both sides of the front end of the cap. Moreover, on the top (i.e., the front end) of the cap, different kinds of lens, such as a spherical lens, aspherical lens and Fresnel lens, can be formed for collimating and focusing. Furthermore, regarding to the focus adjustment, a voltage is applied to the metal leads to excite the laser beam, and then the position of the cap with a lens system on its front end is shifted forward and backward to adjust the focus, the joint of the cap and header is adheringly fixed to the bottom of cap and the flange of header after the focus is well adjusted. In addition, the focus adjustment and optical power measurement can be made before the sealing process, thus improving the yield.

BRIEF DESCRIPTION OF THE DRAWINGS

The following detailed description, given by way of example and not intended to limit the invention solely to the embodiments described herein, will best be understood in conjunction with the accompanying drawings in which:

FIG. 3b is another diagram illustrating the preferred embodiment shown in FIG. 3a;

FIGS. 6a to 6e illustrate one manufacturing process of the present invention.

In all of the drawings, identical reference number represents the same or similar component of the semiconductor laser apparatus utilized for the description of the present invention.

DETAILED DESCRIPTION OF THE PREFERRED EMBODIMENTS

Figure 2:
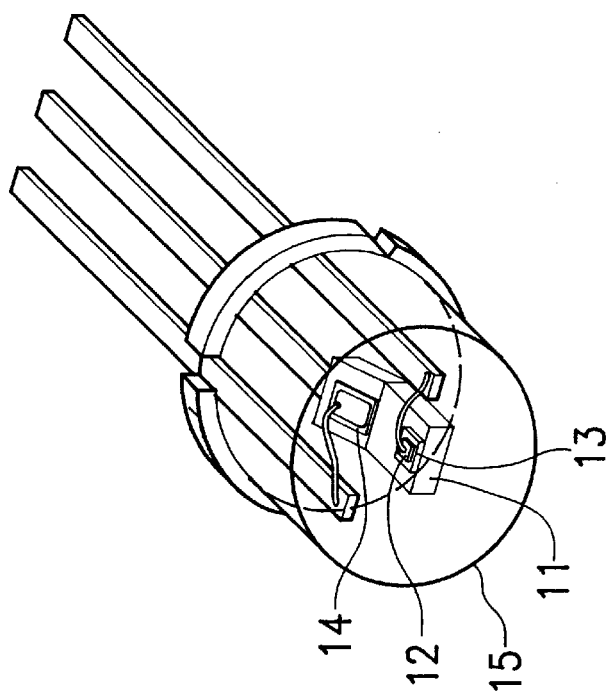
FIG. 2 schematically illustrates another conventional semiconductor laser apparatus.
Figure 1:
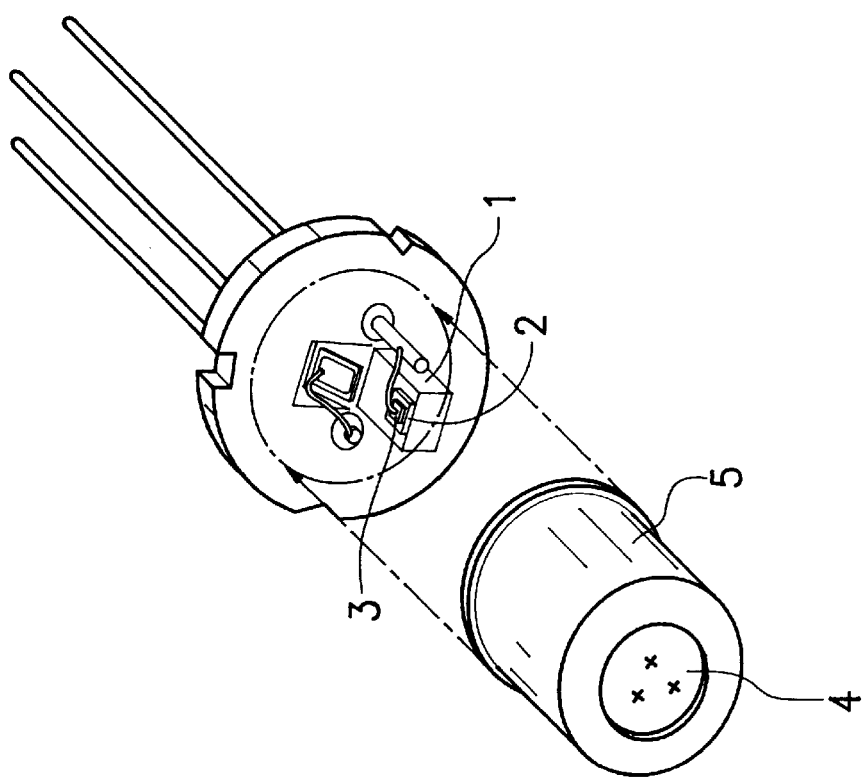
FIG. 1 schematically illustrates a conventional semiconductor laser apparatus.
Figure 3A:
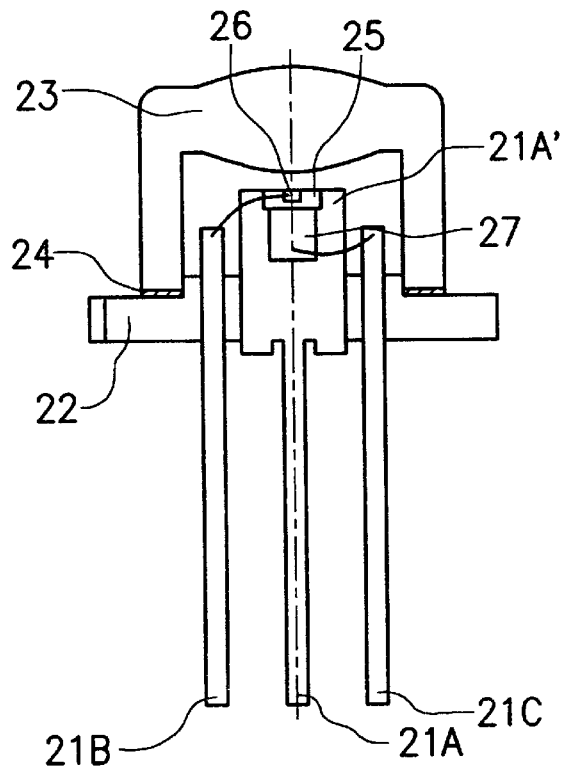
FIG. 3a is a diagram illustrating a preferred embodiment of the present invention.

Referring to FIG. 3a, the plastic-molded apparatus of semiconductor laser of the present invention includes: a first lead 21A having a mounting plate 21A' which is a broad end of the first lead 21A; a second lead 21B located at one side of the first lead 21A; a third lead 21C located at the other side of the first lead 21A; a silicon submount 25 located in the front end of the mounting plate 21A'; a semiconductor laser chip 26, disposed on the silicon submount 25, electrically connecting to the second lead 21B; a monitor detector 27, disposed on the mounting plate 21A' closely adjacent to the silicon submount 25, electrically connecting to the third lead 21C, for receiving backward light from the semiconductor laser chip 26; a plastic-molded header 22 to fix the three leads 21A, 21B and 21C; and a transparent cap 23, adapted to the plastic-molded header 22, for sealing all of the components on the plastic-molded header 22.

Figure 3B:
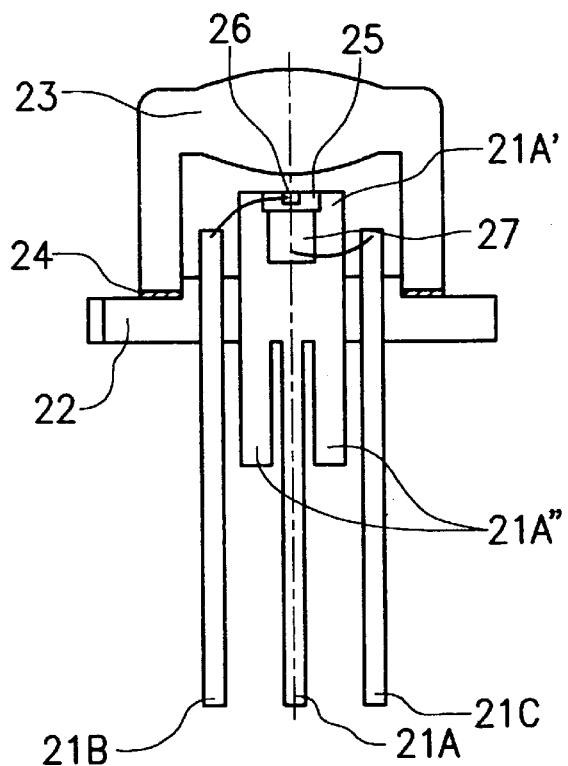

Referring to FIG. 3b, the mounting plate 21A' further includes two heat-dissipation plates 21A". Therefore, heat generated by the semiconductor laser chip can be radiated outside through the heat-dissipation plates 21A" extending from the mounting plate 21A'. The two heat-dissipation plates can be curved as shown in FIG. 3a to be adapted to the assembly of a semiconductor laser apparatus.

The manner of sealing the apparatus as shown in FIG. 3a is to fit the inner circumference of the cap 23 to the flange of the plastic-molded header 22. Then epoxy 24 is used to fix the contact surface and seal the cavity formed between the cap 23 and the header 22. Meanwhile, the cavity is filled with $N_2$ gas to avoid oxidizing of the laser chip.

For the semiconductor laser apparatus without a lens system to be provided on the front end of the cap 23, the manufacturing process can be simplified since no focus adjusting step is needed. Referring to FIG. 4a, the tenon and mortise joint can be applied on the inner circumference 23A of the cap 23 and the outer circumference 22A of the header. That is, the tenon on the cap 23 is directly fitted in the mortise of the header 22 while sealing.

Figure 4B:
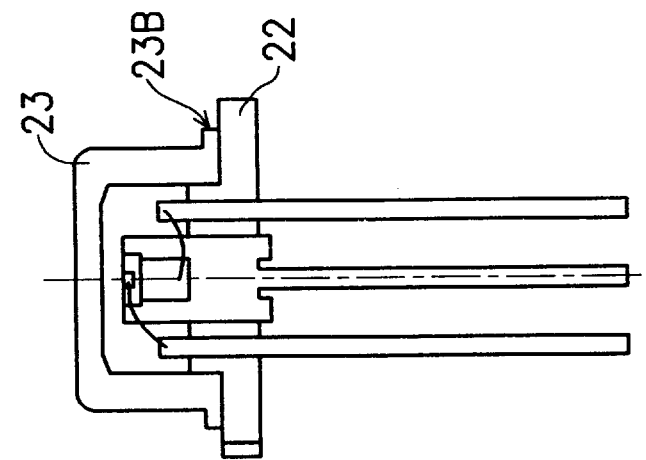
FIGS. 4a and 4b schematically illustrate the manners of combining the cap and the header in the preferred embodiments of the present invention.
Figure 4A:
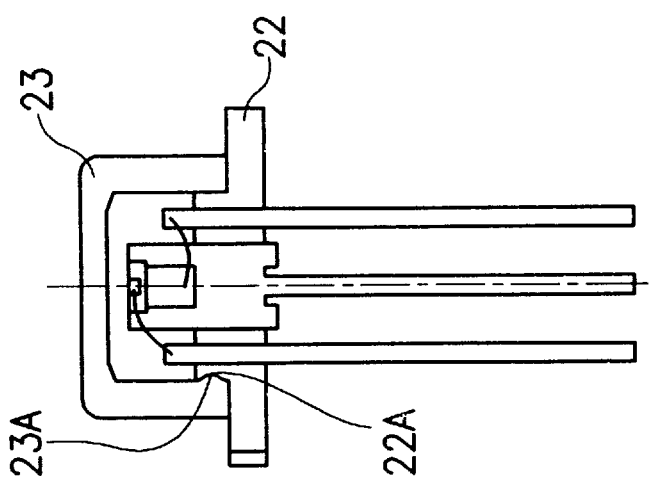

Referring to FIG. 4b, another manner of sealing the semiconductor laser apparatus without a lens system to be provided on the front end of the cap 23 is explained below. A flange 23B is formed on the rear end of the cap 23, the flange 23B is thus fixed on the header 22 by thermopressing the flange 23B thereon. However, the above two methods can be used only on a semiconductor laser apparatus in which focus adjustment is not necessary.

Figure 5C:
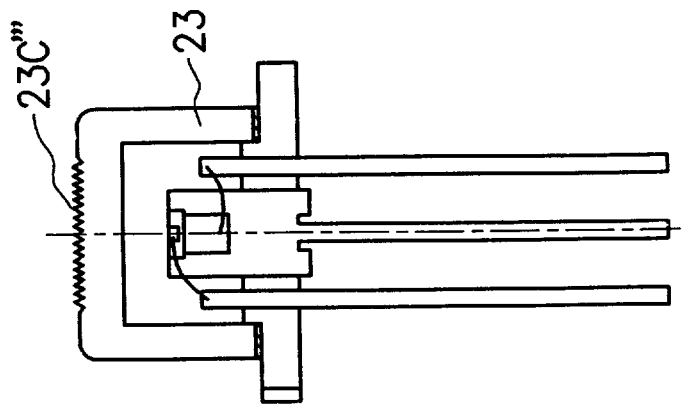
FIGS. 5a to 5c schematically illustrate the manners of fabricating different kinds of lens on the cap of the preferred embodiments according to the present invention.
Figure 5B:
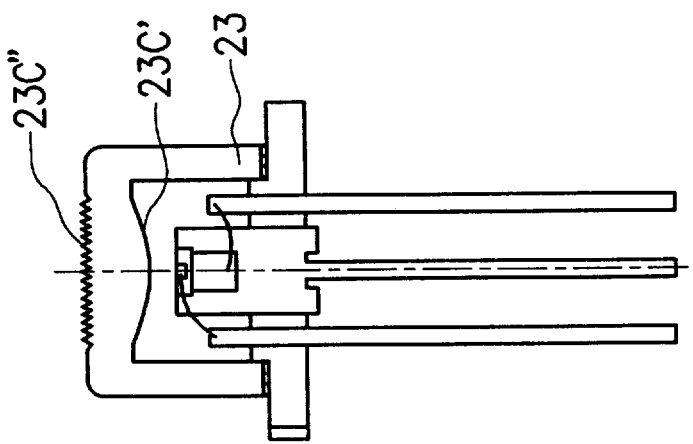
Figure 5A:
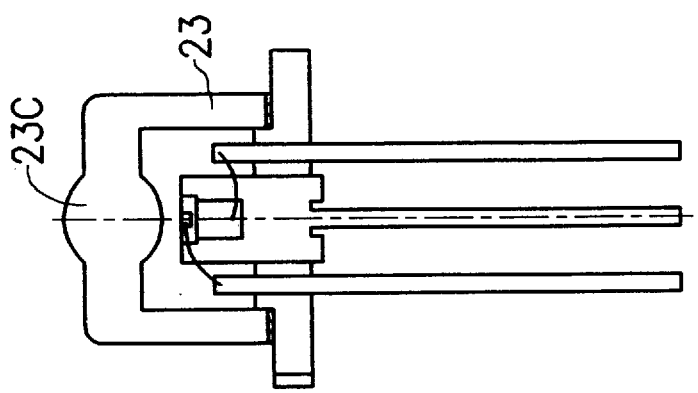

Referring to FIGS. 5a to 5c, for the semiconductor laser apparatus to be provided with a lens system on the front end of the cap, it is much easier to form a desired lens system directly on the front end of the cap. As shown in FIG. 5a, both the inner side and outer side can be formed with a spherical or aspherical convex lens 23C. Another embodiment is as shown in FIG. 5b to form a spherical convex lens 23C' on the inner side and a holographic film 23C" on the outer side of the front end of the cap 23. In addition, as shown in FIG. 5c, still another manner is to form a Fresnel lens 23C'" on one side of the front end of the cap 23.

Furthermore, no matter whether is a lens system formed on the cap or not, an AR (anti-reflection) coating can be formed on both sides of the front end of the cap to prevent the laser beam from reflecting.

Next, a practical manufacturing process for the present invention is explained. Referring to FIGS. 6a to 6e, the process comprises the steps of: a lead frame 30 as shown in FIG. 6a is first put in an injection molding machine (not shown in the drawings), and is mounted on a fixed device 32 of the injection molding machine; then, in FIG. 6b, an injection molding piece 31 including a plurality of plastic-molded headers is formed on the lead frame 30; afterward, as shown in FIG. 6c, metal connections 33 of the lead frame 30 as shown in FIG. 6b are cut off to isolate the electrical connections between the metal leads; thereafter, a laser chip and a monitor detector can be disposed on each mounting plate 34, meanwhile, the laser chip and monitor detector are respectively bonded to different leads by gold wire; referring to FIG. 6e, a voltage is applied to the metal leads 36 to excite the laser beam, and then the position of a cap 35 with a lens system on its front end is shifted forward and backward to adjust the focus. The joint of the cap 35 and the header is adheringly fixed to seal the cavity formed by the cap and the header after the focus is well adjusted. Then the product is accomplished as shown in FIG. 3b after cutting off connecting portions of the injection molding piece 31.

As to the semiconductor laser apparatus having no lens system formed on the cap, the cap may directly engaged with the header after bonding wires between the leads and the laser chip and the monitor detector, then cutting off the metal connections, curving the heat-dissipation plates. Thus, a product as shown in FIG. 3a may be obtained.

What is claimed is:

1. A plastic-molded apparatus for a semiconductor laser, comprising:

a first lead having a broad end thereof serving as a mounting plate;

a second lead locating at one side of the first lead;

a third lead locating at other side of the first lead, the first lead, the second lead and the third lead being essentially planar;

a submount, disposed on a front end of the mounting plate, having a semiconductor laser chip disposed thereon, electrically connecting to the second lead, and a monitor detector disposed on the mounting plate and adjacent to the submount, electrically connecting to the third lead, for receiving backward light from the semiconductor laser chip;

a plastic-molded header to fix the first lead, the second lead and the third lead; and a transparent cap, corresponding to the plastic-molded header, for sealing all components on the plastic-molded header; and at least one heat-dissipation plate, extending from the mounting plate outside of the semiconductor laser apparatus, for conducting heat generated by the semiconductor laser chip to outside of the plastic-molded apparatus.

2. A plastic-molded apparatus for a semiconductor laser as claimed in claim 1 wherein both of inner and outer sides of the transparent cap are flat.

3. A plastic-molded apparatus for a semiconductor laser as claimed in claim 1 wherein the inner side and the outer side of the front end of the transparent cap are respectively formed with a lens and a holographic film.

4. A plastic-molded apparatus for a semiconductor laser as claimed in claim 1 wherein the front end of the transparent cap is formed as a Fresnel lens.

5. A plastic-molded apparatus for a semiconductor laser as claimed in claim 1 wherein a contact surface of the transparent cap and the plastic-molded header is mortise and tenon joint.

6. A plastic-molded apparatus for a semiconductor laser as claimed in claim 1 wherein the transparent cap has a flange around the bottom thereof for sealing the transparent cap by thermally pressing the flange.

7. A plastic-molded apparatus for a semiconductor laser as claimed in claim 1 wherein the plastic-molded header is light-absorbing.

8. A plastic-molded apparatus for a semiconductor laser as claimed in claim 1 wherein the transparent cap and the plastic-molded header are fixedly adhered by epoxy resin after focusing when the transparent cap has a light converged component formed thereon.

9. A plastic-molded apparatus for a semiconductor laser as claimed in claim 1 wherein the front end of the transparent cap is formed as a lens.

10. A plastic-molded apparatus for a semiconductor laser as claimed in claim 1 wherein the front end of the transparent cap is formed as a two-sided lens.

11. A plastic-molded apparatus for a semiconductor laser as claimed in claim 9 wherein the lens is a spherical lens.

12. A plastic-molded apparatus for a semiconductor laser as claimed in claim 9 wherein the lens is a ball lens.

13. A plastic-molded apparatus for a semiconductor laser as claimed in claim 10 wherein the lens is a spherical lens.

14. A plastic-molded apparatus for a semiconductor laser as claimed in claim 10 wherein the lens is a ball lens.

* * * * *